United States Patent [19]

Lang et al.

[11] Patent Number: 5,234,790
[45] Date of Patent: Aug. 10, 1993

[54] PEEL-APART PHOTOSENSITIVE ELEMENT

[75] Inventors: Charles D. Lang, Wysox; Scott D. McCalmont, Athens; John Choi, Sayre; Anchi Hou, Towanda; Alan Shobert, Sayre, all of Pa.

[73] Assignee: E. I. Du Pont de Nemours and Company, Wilmington, Del.

[21] Appl. No.: 841,398

[22] Filed: Feb. 25, 1992

Related U.S. Application Data

[63] Continuation-in-part of Ser. No. 663,999, Mar. 4, 1991, abandoned.

[51] Int. Cl.[5] ............... G03C 1/90; G03C 11/12; G03F 7/26
[52] U.S. Cl. .................. 430/253; 430/257; 430/263; 430/291
[58] Field of Search ............... 430/253, 291, 257, 263

[56] References Cited

U.S. PATENT DOCUMENTS

| | | | |
|---|---|---|---|
| 4,174,216 | 11/1979 | Cohen et al. | 430/257 |
| 4,247,619 | 1/1981 | Cohen et al. | 430/253 |
| 4,489,154 | 12/1984 | Taylor | 430/253 |
| 5,001,036 | 3/1991 | Choi | 430/258 |
| 5,087,549 | 2/1992 | Peiffer | 430/253 |

Primary Examiner—Richard L. Schilling

[57] ABSTRACT

A multilayer, photosensitive element comprising a coversheet, a photohardenable layer, a contiguous layer, an isolation layer, an adhesive layer, and a support, is described. The element is used for image reproduction.

21 Claims, 1 Drawing Sheet

PEEL-APART PHOTOSENSITIVE ELEMENT

CROSS REFERENCE TO RELATED APPLICATION

This application is a continuation-in-part of Ser. No. 07/663,999, now abandoned, Peel-Apart Photosensitive Element, filed Mar. 4, 1991.

FIELD OF THE INVENTION

This invention relates to a multilayer, photosensitive element for image reproduction. More particularly, it relates to a photosensitive element comprising a coversheet, a photohardenable layer, a contiguous layer, an isolation layer, an adhesive layer, and a support.

BACKGROUND OF THE INVENTION

Photosensitive elements for image-reproduction are well-known in the graphics arts industry. Elements are exposed to actinic radiation through an image-bearing transparency, such as a color separation transparency, to produce an image that is either a positive or negative of the transparency. After imagewise exposure, the photosensitive elements are developed by washing out the soluble image areas, toning with a colorant, peeling apart, or combinations of these techniques.

Peel-apart photosensitive elements, which do not require a solvent for their development, are disclosed in Cohen, U.S. Pat. Nos. 4,174,216 and 4,247,619. These elements comprise, in order a strippable coversheet, a photoadherent photohardenable layer, a tonable contiguous layer, and a support. The element is imagewise exposed through the coversheet, and the coversheet is subsequently peeled off. The exposed areas of the photosensitive layer adhere to the coversheet and are removed, revealing the tonable contiguous layer. The unexposed areas of the photosensitive layer which remain on the contiguous layer do not accept toner. The revealed contiguous layer is toned in a succeeding step to produce a negative image of the transparency used for exposure. The toned image may be used as a single-color surprint proof.

The process described above can be used to produce a multicolored image. First, the support is removed from a photosensitive element thereby revealing the contiguous layer. The contiguous layer of the resulting element is adhered to the exposed and peeled-apart photohardenable layer of a previously formed colored image. The resulting element is then imagewise exposed through the coversheet, peeled-apart, and toned with a different colored toner to produce a two-color image. This sequence of steps may be repeated as many times as desired to produce a multicolored surprint proof.

The elements disclosed by Cohen have numerous advantages for the production of colored images. However, imperfections known as "pickoff defects" can occur during image formation. In addition, these elements may have a higher dot gain than the press print. A high dot gain is unsuitable in the printing industry.

Pickoff defects occur when portions of the contiguous layer adhere to the exposed photohardenable layer and are removed with the photohardenable layer when the exposed element is peeled apart. Regions which should accept toner are not able to do so because the tonable contiguous layer has been removed. Also, in the production of multicolored images, the contiguous layer from an earlier formed colored image may be revealed and accept toner during the toning process. Consequently, pickoff defects have a deleterious effect on the image and may make it unsuitable for use as a prepress proof.

The production and mounting of printing plates is expensive and time consuming. Thus, it is essential that a proof accurately predict the appearance and quality of the image obtained by printing. The dots on a halftone press print are larger than the dots on the corresponding halftone separation transparency. This phenomenon is known as dot gain. A discussion of dot gain and its causes can be found in *Principles of Color Proofing*, by Michael H. Bruno, GAMA Communications, Salem, NH, 1986, pp 84–87. For a prepress proof to be an acceptable representation of the press print, it must accurately duplicate the dot gain of the press print. The elements described by Cohen generally produce too much dot gain and thus, the resulting proof does not completely simulate the press print.

Precolored peel apart photosensitive elements, in which the photohardenable layer comprises a colorant, are disclosed in Taylor, U.S. Pat. No. 4,489,154, and in Choi, U.S. Pat. No. 5,001,036. In certain instances, these elements have an advantage over tonable elements because it is unnecessary to apply a colorant to the element after it has been exposed and peeled apart. Although these elements have been used to produce overlay proofs, it has not been possible to use them to produce multicolor surprint proofs due to pickoff defects.

Accordingly, a need exists for a photosensitive element which does not have pickoff defects and which more accurately duplicates the dot gain of the printing press.

SUMMARY OF THE INVENTION

In one embodiment, this invention concerns a multilayer, peel-apart, photosensitive element comprising, in order:
(1) a strippable coversheet which is transparent to actinic radiation;
(2) a photohardenable layer;
(3) a contiguous layer; and
(4) a support;
wherein the adhesive relationship is such that, on peeling apart, either the unexposed or exposed regions of said photohardenable layer are removed with said coversheet while the other of said unexposed and exposed regions remain on said contiguous layer;
the improvement wherein said photosensitive element additionally comprises:
(5) a non-elastomeric isolation layer; and
(6) an adhesive layer;
wherein said isolation layer and said adhesive layer are arranged so that the photosensitive element comprises, in order from top to bottom, said coversheet, said photohardenable layer, said contiguous layer, said isolation layer, said adhesive layer, and said support.

In a preferred embodiment of this invention, the photohardenable layer comprises a monomer, a binder, and a photoinitiator system activatible by actinic radiation. In another preferred embodiment, the unexposed regions of the photohardenable layer adhere more strongly to the contiguous layer and the exposed regions of the photohardenable layer adhere more strongly to the coversheet. In yet another preferred embodiment, the photohardenable layer additionally comprises a colorant and the support is removable.

This invention also concerns improved processes for forming colored images using the multilayer, peel-apart, photosensitive elements of the invention.

Few, if any, pickoff defects are produced when a photosensitive element of this invention is used to produce a colored image. The number of images unsuitable for use as surprint proofs is greatly reduced. Surprisingly and unexpectedly, dot gain is also reduced. The colored image closely simulates the image produced by printing.

DETAILED DESCRIPTION OF THE INVENTION

Figure 1A:
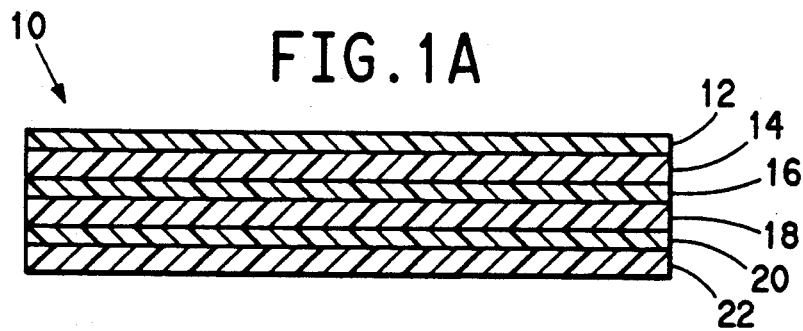
FIG. 1A illustrates a photosensitive element of this invention.

In accordance with the invention, there is provided, a peel-apart photosensitive element adapted for the preparation of colored images. Referring to FIG. 1A, the photosensitive element (10) comprises, in order, a coversheet (12), a photohardenable layer (14), a contiguous layer (16), an isolation layer (18), an adhesive layer (20), and a support (22).

Figure 1B:
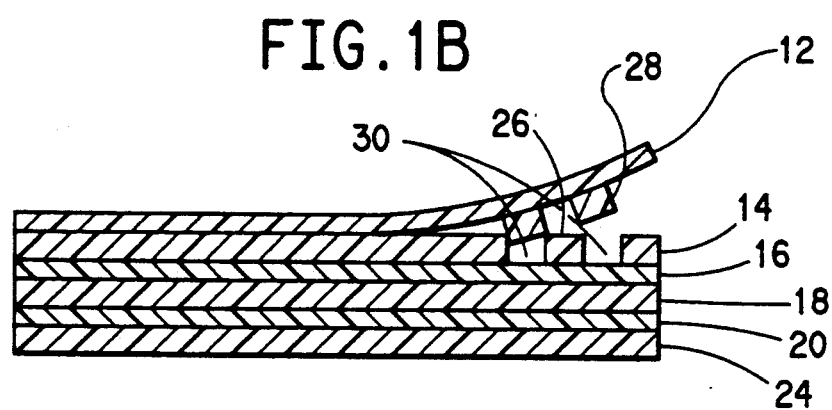
FIG. 1B illustrates a preferred embodiment of this invention, that is, a photoadherent photosensitive element, with the support removed and adhered to a receptor, being peeled apart following exposure to actinic radiation.

In one preferred embodiment, the support (22) is removable. Referring to FIG. 1B, the support (22) has been removed and the element minus support (22) is adhered to a receptor (24). The adhesive relationship of the photohardenable layer (14) relative to the coversheet (12) and contiguous layer (16) is such that the unexposed regions (26) of the photohardenable layer (14) adhere more strongly to the contiguous layer (16) and the exposed regions (28) of the photohardenable layer (14) adhere more strongly to the coversheet (12) and are thus removed. If the element is not precolored, i.e., the photohardenable layer (14) does not comprise a colorant, the revealed regions (30) of the contiguous layer (16) are toned to produce a colored image which is a negative of the transparency used for exposure. Thus, the element is said to be "negative working". If the element is precolored, i.e., the photohardenable layer (14) comprises a colorant and therefore does not need to be subsequently toned, the unexposed regions (26) which remain on the contiguous layer (16) form a colored image which is a positive of the transparency used for exposure. Thus, the element is said to be "positive working".

Figure 1C:
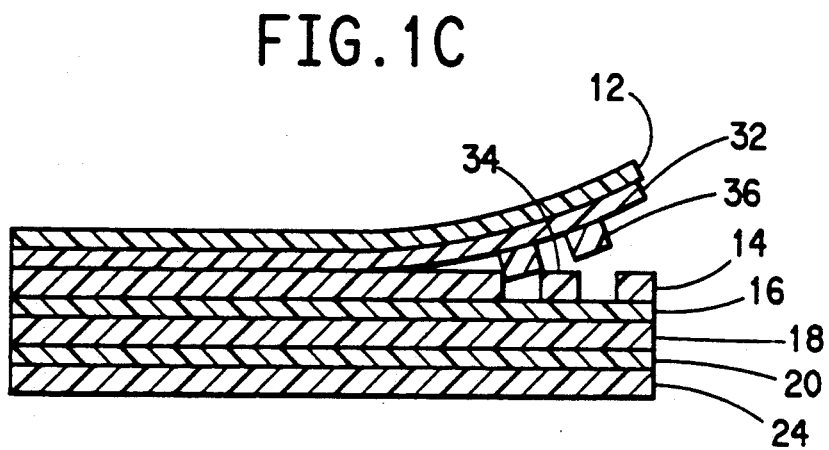
FIG. 1C illustrates another preferred embodiment of the invention, that is, a photosensitive element additionally comprising a photorelease layer, with the support removed and adhered to a receptor, being peeled apart following exposure to actinic radiation.

In another preferred embodiment, the support (22) is removable, and the element (10) is precolored, and additionally comprises a photorelease layer between the coversheet and the photohardenable layer. Referring to FIG. 1C, the support (22) has been removed and the element minus the support (22) is adhered to a receptor (24). The adhesive relationship of the photohardenable layer (14) relative to the coversheet (12) and the contiguous layer (16) is altered by the photorelease layer (32) such that the exposed regions (34) of the photohardenable layer (14) adhere to the contiguous layer (16) and the unexposed regions (36) of the photohardenable layer (14) adhere more strongly to the photorelease layer (32) and the coversheet (12) and are removed. The exposed regions (34) of the photohardenable layer (14) which remain on the contiguous layer (16), produce a colored image which is a negative of the transparency used for exposure. Thus, the element is said to be "negative working".

The terms "positive-working" and "negative-working" as used herein, refer to the relationship of the final image produced by the element to the transparency used for exposure, and not to the operation of the element. Positive-working elements produce a duplicate image of the transparency; that is, the colored regions of the transparency are colored and the uncolored regions in the transparency are uncolored in the final image. Negative-working elements produce an image that is the reverse of the transparency; that is, the colored regions of the transparency are uncolored and the uncolored regions in the transparency are colored in the final image.

Non-precolored and precolored peel apart elements in which the exposed regions are removed with the coversheet on peeling apart, i.e., the element operates by photoadherence, will produce opposite images. Thus, in the non-precolored element, the exposed regions (28) of the photohardenable layer (14) are removed, revealing the contiguous layer (16) which is then toned. In the final image, the colored regions correspond to the exposed regions of the photohardenable layer (14) which, in turn, correspond to the uncolored regions of the transparency. Since the colored regions of the final image correspond to the uncolored regions in the transparency, a negative image is produced.

In a precolored element, removal of the exposed regions (28) of the photohardenable layer (14) also leaves the unexposed regions (26) of the photohardenable layer (14) on the contiguous layer (16). However, since the unexposed regions (26) are precolored, in the final image, the colored regions of the image correspond to the colored regions of the transparency used for exposure. Thus, a positive image is produced.

In elements in which the unexposed regions are removed on peeling apart, i.e., the element operates by photorelease, the opposite effect will be observed. Thus, a non-precolored element will, on peeling apart and toning, produce a positive image. On peeling apart, a precolored element will produce a negative image.

The normal operation of a photoadherent element may be reversed, i.e., act as if it was not a photoadherent element, by the process disclosed in Taylor, U.S. Pat. No. 4,987,051. In this process the coversheet (12) is first removed, and the element is imagewise exposed. Following imagewise exposure, the coversheet (12) is replaced, and the element is overall exposed. The element is subsequently peeled apart. In this process, the exposed regions of the photohardenable layer (14) remain on the contiguous layer (16) and the unexposed regions are removed with the coversheet (12). The use of this process is considered to be equivalent to using a photorelease peel-apart photosensitive element.

CONTIGUOUS LAYER/ADHESIVE LAYER

The contiguous layer (16) is a tacky, or slightly soft, deformable material which is able to accept toner. To produce an element with good aging stability, suitable materials for the contiguous layer should resist monomer diffusion from the photohardenable layer into the contiguous layer. In addition, these materials should not migrate into the photohardenable layer. Preferred materials are elastomeric polymers and mixtures thereof, which are inherently tacky at ambient temperatures, such as, for example, natural or synthetic rubbers. Especially preferred materials are polymers of butadiene or isoprene and random, teleblock, block copolymers of butadiene or isoprene copolymerized with styrene, and poly(alpha-olefins) in which the alpha-olefin contains from about five to about ten carbon atoms. For nonprecolored tonable elements, the contiguous layer must be tonable, i.e., the toner must adhere to the contiguous layer. For precolored elements, it's not essential for the contiguous layer to be tonable. The contiguous layer may also contain oxidation inhibitors, optical brighteners, ultraviolet absorbers, antihalation agents, and the like. A preferred oxidation inhibitor is Irganox ® 1010, which is preferably present at a level of 0.1% to 1% by weight.

The adhesive layer (20) adheres the element to the support (22) or to the exposed and peeled apart photohardenable layer of the previous element when the element is used to prepare a multicolor image. Preferred materials for the adhesive layer (20) are elastomeric polymers and mixtures thereof, which are inherently tacky at ambient temperatures, such as the polymers described above for the contiguous layer (16). The same material may be used in both the contiguous layer and the adhesive layer. Alternatively, different materials may be used.

ISOLATION LAYER

The isolation layer (18) comprises a film forming organic polymer which is less deformable than the polymers contained in the contiguous layer and the adhesive layer. The isolation layer must also possess good clarity and low color. In addition, it must adhere to the contiguous layer and to the adhesive layer. Various non-elastomeric organic polymers which can be used include (a) polymers and copolymers of vinyl acetate, such as, for example, poly(vinyl acetate) and ethylene/vinyl acetate copolymer; (b) acrylic and methacrylic polymers and copolymers, such as, for example, poly(methyl methacrylate), poly(ethyl methacrylate), poly(n-butyl methacrylate), poly(isobutyl methacrylate), and methyl methacrylate/butyl methacrylate copolymers; and (c) compatible mixtures thereof. A preferred polymer is poly(vinyl acetate).

PHOTOHARDENABLE LAYER

The photohardenable layer (14) is one whose adhesive relationship relative to the coversheet (12) and the contiguous layer (16) is such that, after exposure to actinic radiation, the unexposed or exposed regions of the photohardenable layer adhere more strongly to the coversheet while the other regions of the photohardenable layer adhere more strongly to the contiguous layer. Materials with ethylenically unsaturated groups which are photohardenable, photopolymerizable, photocrosslinkable, and/or photodimerizable, are used in the photohardenable layer, and are "photohardenable" within the meaning of this application. The preferred photohardenable compositions are photopolymerizable and comprise an organic polymeric binder, an addition polymerizable ethylenically unsaturated monomer, and an initiator system activatible by actinic radiation.

In an element which operates by photoadherence, the element (10), is imagewise exposed and the exposed regions of the photohardenable layer are removed with the coversheet when the element is peeled apart. Photoadherent peel-apart photosensitive elements are disclosed in Cohen, U.S. Pat. Nos. 4,174,216 and 4,247,619; and Taylor, U.S. Patent, U.S. Pat. No. 4,489,154.

In an element which operates by photorelease, the element (10), is imagewise exposed and the unexposed regions of photohardenable layer are removed with the coversheet when the element is peeled apart. Photorelease photosensitive elements are disclosed in Cohen, U.S. Pat. No. 4,282,308; Choi, U.S. Pat. No. 5,001,036; and Applicant's assignee's U.S. patent application No. 07/542,470, filed on Jun. 22, 1990 and U.S. patent application No. 07/741,715 filed Aug. 7, 1991.

MONOMERS/BINDERS

The monomer has at least one and preferably two or more terminal ethylenically unsaturated groups capable of free-radical initiated, chain propagated, addition polymerization, and preferably has some degree of polarity. In addition, the monomer must be compatible with the binder and substantially nondiffusible in the contiguous layer. Useful monomers include epoxy monomers containing ethylenic unsaturation, such as those disclosed in Crary, U.S. Pat. No. 3,661,576. Preferred monomers are the diacrylate and dimethacrylate esters of the epichlorohydrin adduct of bis-phenol A.

The binder can be a polar material, such as an acidic polymer containing at least 1.5 mole percent free acid groups to impart polarity to the polymer, or a nonpolar material such as the materials described in Burg, U.S. Pat. No. 3,060,023; Chu, U.S. Pat. No. 3,649,268; and Collier, U.S. Pat. No. 3,984,244. Suitable binders include polymers of methyl acrylate, methyl methacrylate, and copolymers thereof. A preferred binder is poly(methyl methacrylate).

PHOTOINITIATOR SYSTEM

The photoinitiator system comprises one or more compounds which directly furnish free-radicals when activated by actinic radiation. It can also comprise a plurality of compounds, one of which yields free-radicals after having been caused to do so by another compound, or sensitizer, which has been activated by the radiation.

Numerous conventional photoinitiator systems may be used provided they (a) are compatible with the other ingredients of the system, (b) do not alter the unique relationship between the coversheet; the contiguous layer; the photorelease layer, if present; and the exposed and unexposed photohardenable layer required for the operation of the element, and (c) do not impart unwanted color to the final image.

Preferred photoinitiator systems are 2,4,5-triphenylimidazolyl dimers in combination with chain transfer agents, or hydrogen donors, such as are disclosed in Chambers, U.S. Pat. No. 3,479,185; Cescon, U.S. Pat. No. 3,784,557; Dessauer, U.S. Pat. No. 4,311,783; and Sheets, U.S. Pat. No. 4,622,286. Preferred hexaarylbisimidazoles (HABI) are 2-o-chlorosubstituted hexaphenylbisimidazoles in which the other positions on the phenyl radicals are unsubstituted or substituted with chloro, methyl or methoxy. The most preferred initiator is o-Cl-HABI, i.e., 1,1'-biimidazole, 2,2'-bis(o-chloro-phenyl)-4,4,'5,5'-tetraphenyl-. A preferred sensitizer is 7-diethylamino-4-methylcoumarin.

Hydrogen donor compounds useful as chain transfer agents in the photopolymer compositions include: 2- mercaptobenzoxazole, 2-mercaptobenzothiazole, 4-methyl-4H-1,2,4,triazole-3-thiol, and the like. A preferred hydrogen donor is 2-mercaptobenzoxazole.

Although the HABI initiating systems described above are preferred, other initiating systems may be used in practicing this invention. Typical free radical-generating addition polymerization initiators include: quinones; ketones, such as Michler's ketone and benzophenone; dialkylamino benzaldehyde; benzaldehyde; dialkylamino benzoate esters; and combinations thereof. Other useful photoinitiators, described in U.S. Pat. No. 2,760,863, include vicinal ketaldonyl alcohols, such as benzoin, pivaloin, acyloin ethers, e.g., benzoin methyl and ethyl ethers; alpha-hydrocarbon-substituted aromatic acyloins, such as alpha-methylbenzoin.

Redox systems, such as those involving dyes, e.g., Rose Bengal/2-dibutylaminoethanol, may be also used. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487. For some applications such as color proofing, the use of dye-based initiator systems, especially those which use dyes whose absorption extends well into the visible region of the spectrum, may be undesirable because such dyes may affect the color of the resulting image.

COLORANTS

If the element is precolored, one or more colorants will be present in the photohardenable layer (14). Dyes and pigments may be used as colorants. Examples of suitable colorants include:

yellow: Cromophtal® Yellow 3G (C.I. No. Pigment Yellow 93), Hostaperm® Yellow 3G (C.I. No. Pigment Yellow 154);

magenta: Monastral® Violet R (C.I. No. Pigment Violet 19), 2,9-Dimethylquinacridone (C.I. No. Pigment Red 122), Indofast® Brilliant Scarlet R6300 (C.I. No. Pigment Red 123), Quindo Magenta RV 6803;

cyan: Monastral® Blue G (C.I. No. Pigment Blue 15), Monastral® Blue (BT 383D) (C.I. No. Pigment Blue 15) Monastral® Blue G (BT 284D) (C.I. No. Pigment Blue 15), Monastral®Green GT (751D) (C.I. No. Pigment Green 7);

black: Raven® 450 (C.I. No. Pigment Black 7), Raven® 1035 (C.I. No. Pigment Black 7), Elftex® 8 (C.I. No. Pigment Black 7), Elftex® 12 (C.I. No. Pigment Black 7).

Other colorants may be used provided that they (a) are compatible with the other ingredients of the system, and (b) do not alter the unique relationship between the coversheet, the contiguous layer, the photorelease layer, if present; and the exposed and unexposed photohardenable layer required for the operation of the element.

OTHER INGREDIENTS

The photohardenable layer (14) of both precolored and non-precolored photosensitive elements may also contain other ingredients which are conventional components of photohardenable systems provided they (a) are compatible with the other ingredients present in the photohardenable layer, (b) do not alter the unique relationship between the coversheet; the contiguous layer; the photorelease layer, if present; and the exposed and unexposed photohardenable layer required for the operation of the element, and (c) do not impart unwanted color to the final image. Such components may include stabilizers, antihalation agents, optical brightening agents, release agents, surfactants, coating aids, plasticizers, fillers, and the like.

For non-precolored, tonable elements, about 3–15% of triacetin and preferably about 5–7%, may be added to the photohardenable layer (14) to prevent fine toned line defects. These defects appear as very fine lines of color in regions of the image which should be uncolored. Triacetin may also be added to the photohardenable layer of precolored photosensitive elements as disclosed in Peiffer, U.S. Pat. No. 5,087,549.

A conventional thermal polymerization inhibitor is normally present to increase the storage stability of the element. The dinitroso dimers described in Pazos, U.S. Pat. No. 4,168,982, may also be useful. However, it is frequently unnecessary to add additional inhibitor because monomers generally contain polymerization inhibitors added by their manufacturers.

Nonionic surfactants may be added to the photohardenable layer as coating aids. Preferred coating aids are polyethylene oxide, such as Polyox® WSRN 3000, and fluorinated nonionic surfactants, such as Fluorad® FC-430.

The addition of optical brightening agents to the photohardenable layer produces an image which is free from distortion due to halation. Useful ultraviolet radiation absorbing materials and brighteners are disclosed in Held, U.S. Pat. No. 3,854,950. Particularly useful optical brighteners are 2-(stibyl-4")-(naphto-1',2',4,5)-1,2,3-triazol-2"-sulfonic acid phenyl ester and 7-(4'-chloro-6'-diethylamino-1',3',5'-triazine-4'-yl) amino-3-phenyl coumarin.

COMPOSITION

The binder must be present in sufficient amount to form a film when the composition is coated. The monomer must be present in sufficient amount to alter the relative adhesive relationship so that, on peeling apart, either the unexposed or exposed regions of the photohardenable layer are removed with the coversheet while the other regions remain on the contiguous layer. The photoinitiator system must be present in sufficient amount to initiate polymerization of the monomer on exposure to actinic radiation. In precolored systems, the colorant must be present in a sufficient amount to uniformly color the image to a sufficient optical density, but not to the extent that it adversely affects the properties of the photohardenable layer, such as photospeed, adhesion, etc., needed for the operation of the element. Optical densities between 1 and 2 are desirable for surprint proofs.

The binder/monomer ratio may vary widely but in general should be about 3:1 to 1:3. The monomer should be compatible with, and may be a solvent for, and/or have a plasticizing action on the binder. The proportions of monomer and binder are made in accordance with the requirements of selective photoadhesion or photorelease and of hardness. To provide a suitable hardness, the monomer concentration is normally kept low so that the photohardenable layer will be sufficiently hard and non-tacky.

For non-precolored, tonable elements, the composition of the photohardenable layer will typically be within the following percentage ranges, based on total weight of the photohardenable layer: about 5–60% monomer, preferably about 35–50%; about 0.1–10% initiator system, preferably about 1–5%; about 25–75% binder, preferably about 35-50%; and about 0-15% other ingredients, preferably about 3-10%.

For precolored elements, in which the photohardenable layer comprises a colorant, the composition will normally contain, based on total weight of the photohardenable layer about 5-60% monomer, preferably about 35-50%; about 0.1-10% initiator system, preferably about 1-5%; about 20-70% binder, preferably about 30-45%; 0.5-20% colorant(s), preferably 8-15%; and about 0-15% other ingredients, preferably about 3-10%.

SUPPORT/COVERSHEET/RECEPTOR

The support (22) may be any suitable film which has the necessary stiffness and dimensional stability and which exhibits proper adhesion to the adhesive layer. A preferred material is polyethylene terephthalate film. A removable support is required for the preparation of a multicolor surprint proof. A silicon release treated polyethylene terephthalate film is preferred for this application. The support is typically about 25 to about 125 microns thick.

The coversheet (12) is strippable, i.e., removable by peeling it apart from the rest of the element. The adhesive relationship of the coversheet to the photohardenable layer will vary depending on whether the element operates by photoadherence or photorelease. For elements which operate by photoadhesion, the exposed regions of the photohardenable layer adhere more strongly to the coversheet while the unexposed regions adhere more strongly to the contiguous layer. For elements which operate by photorelease, the unexposed regions of the photohardenable layer adhere more strongly to the coversheet while the exposed regions adhere more strongly to the contiguous layer.

The coversheet (12) must be transparent to actinic radiation because irradiation is carried out through the coversheet. The topography of the coversheet may be altered, and its polarity increased, by electrostatic discharge treatment as disclosed by Buzzell, U.S. Pat. No. 4,356,253 or by flame treatment with an air-propane flame. This will enable the exposed areas of the photohardenable layer to adhere better to the surface of the coversheet. Preferred materials for the coversheet are polymeric films, particularly polyethylene terephthalate film. For elements which operate by photoadhesion, the most preferred material is an electric discharge treated polyethylene terephthalate film. For elements which operate by photorelease and which additionally comprise a photorelease layer, the most preferred material is untreated polyethylene terephthalate film.

While the thickness of the coversheet may vary over a wide range, films having a thickness of about 13-50 microns are preferred. Although thinner coversheets produce halftone dots of good roundness with sharp edges, the coversheet should be thick enough to prevent tearing when it is stripped from the element. If the coversheet is to be flame or electric discharge treated, it should be thick enough to prevent such treatment from injuring the coversheet. In general, a rapid rate of coversheet stripping produces better image quality.

The receptor (24) may be any material which has the necessary stiffness and dimensional stability. The receptor is flat and preferably smooth and opaque. Exemplary materials which may be used as the receptor include adhesive subbed opaque polyethylene terephthalate film base, e.g., Melinex ® 994 (ICI Americas Inc., Wilmington, Del.); and paper stock, e.g., Kromekote ® opaque white paper (Champion Paper Co., Stamford, Conn.), or Cromalin ® receptor stock (E. I. du Pont de Nemours and Company, Wilmington, Del.). The preferred material is an opaque white paper.

PHOTORELEASE LAYER

Photosensitive elements which operate by photorelease may comprise photohardenable compositions which photorelease, such as those described by Cohen, U.S. Pat. No. 4,282,308, and those described in U.S. patent application No. 07/542,470, filed on Jun. 22, 1990. Alternatively, photosensitive elements that operate by photorelease may comprise a photorelease layer (32) situated between the coversheet (12) and the photohardenable layer (14). The photorelease layer modifies the adhesive relationship between the coversheet and the photohardenable layer so that after the photohardenable layer has been exposed to actinic radiation, the unexposed, i.e., unphotohardened regions of the photohardenable layer, adhere more strongly to the coversheet than to the contiguous layer and are removed with the coversheet. The exposed, i.e., photohardened, regions of the photohardenable layer adhere more strongly to the contiguous layer than to the coversheet and remain on the contiguous layer when the element is peeled apart.

Agents suitable for use in photorelease layers are disclosed in Choi, U.S. Pat. No. 5,001,036. These photorelease agents are solid, polymeric compounds which consist essentially of the oxyethylene repeat unit, i.e.:

Various end groups, such as hydroxyl or alkoxyl, may be present. While small amounts of co-monomers (up to about 5%) may be present in the polyoxyethylene chain, provided the polymer is still solid at room temperature, oxyethylene homopolymers are preferred.

Oxyethylene homopolymers are generally divided, on the basis of molecular weight into two groups. Those two groups are (a) polyethylene glycols and (b) polyethylene oxides. Both groups, however, are oxyethylene homopolymers with primary hydroxyl end groups, i.e., $H(OCH_2CH_2)_nOH$.

The polyethylene glycols are a series of low to medium weight homopolymers of ethylene oxide. They can be regarded chemically as polyether diols consisting of long, linear chains of oxyethylene units with primary hydroxyl groups at each end. Depending on chain length, they range in physical form at room temperature from viscous liquids (MW 200-700), to waxy semisolids (MW 100-2000), to hard, waxlike solids (MW 3,000 to 20,000 and above).

The polyethylene oxides are a series of high molecular weight oxyethylene homopolymers. They are free-flowing white powders commercially available in a broad range of molecular weight grades, i.e., as low as 100,000 to as high as 5,000,000. Polyethylene oxides are available from the Union Carbide Corporation under the tradename Polyox ®. Oxyethylene polymers are discussed in detail in Chapters 18 and 19 of *Handbook of Water-Soluble Gums and Resins*, R. L. Davidson, Ed., McGraw-Hill, New York, 1980.

The photorelease agent is typically coated onto the coversheet. Thus, the polymer used as a photorelease agent, must be of sufficient molecular weight to be a solid at ambient temperature. The polymer must also form a film at ambient temperature. Although polyethylene oxides with varying molecular weights can be used, oxyethylene homopolymers with a molecular weight greater than 20,000 are preferred. More preferred are oxyethylene homopolymers in the molecular weight range of about 100,000 to about 600,000. The most preferred photorelease agents have a molecular weight of about 300,000 to 400,000.

The photorelease layer consists essentially of the photorelease agent, but it may also contain minor amounts of other ingredients that do not materially affect its essential characteristic, i.e, photorelease. Preferably the photorelease layer will contain at least 65%, and more preferably, at least 75% of a photorelease agent.

Other ingredients can be added to the photorelease layer to improve performance. For example, a surfactant may be added as a coating aid. Preferred coating aids for the photorelease layer are low molecular weight, non-ionic polyethylene oxide/polypropylene oxide/polyethylene oxide copolymers. The coating aid may be added at 014 1% (weight/volume) of the coating solution, preferably at about 0.1% (weight/volume) of the coating solution.

The addition of poly(vinyl pyrrolidone) (PVP) to the photorelease layer improves image quality by providing a cleaner separation of the coversheet when the element is peeled apart. A preferred PVP is PVP K-90, a high molecular weight PVP. PVP may be added as 0–5% of the photorelease Poly(acrylic acid) improves aging performance and reduces peel sensitivity, that is, the sensitivity of the quality of the image to the rate and smoothness of the peeling apart of the element. Poly(acrylic acid) may be added at about 0–10% of the photorelease layer, and preferably about 4–10%.

MANUFACTURE

The photohardenable layer (14) is prepared by (a) mixing the ingredients of the system in a suitable solvent, such as dichloromethane, usually in the weight ratio of about 15:85 to 25:75 (solids to solvent), (b) coating the photohardenable layer onto a coversheet (12), and (c) evaporating the solvent. The coating should be uniform. The coating weight is typically about 15–40 mg/dm$^2$, and preferably about 20–30 mg/dm$^2$.

Any suitable solvent may be used to coat the contiguous layer (16), isolation layer (18), and adhesive layer (20). The coatings should be uniform. The contiguous layer typically has a dry coating weight of about 5 to 120 mg/dm$^2$, preferably 10 to 80 mg/dm$^2$. The isolation layer typically has a dry coating weight of 20 to 100 mg/dm$^2$. The adhesive layer typically has a dry coating weight of 15 to 70 mg/dm$^2$.

The photorelease layer (32) may be coated onto the coversheet (12) from water or any other solvent or solvent mixture in which it is soluble. Good image reproduction requires formation of a discrete, uniform, contiguous film. The photorelease layer may be 0.03 to 0.3 micron thick, preferably 0.05 to 0.2 micron, and more preferably, about 0.1 to 0.15 micron thick.

The photosensitive element (10) may be prepared using conventional coating techniques. If the photorelease layer is not present, the photohardenable layer is coated onto the coversheet. After the solvent has evaporated, a release film, such as polyethylene, may be placed over the coating to protect the photohardenable layer until the rest of the element is formed. The contiguous layer is then coated over the photohardenable layer. If a release film is present on the photohardenable layer, it must be stripped off before the contiguous layer is coated. The adhesive layer is coated onto the support. Following evaporation of the solvent, the isolation layer is coated onto the adhesive layer. After the solvent has evaporated, the surface of the isolation layer is laminated to the surface of the contiguous layer.

The photosensitive element (10) may also be prepared using conventional multilayer coating techniques. For example, the photohardenable layer and the contiguous layer may be coated simultaneously onto the coversheet. Similarly, the adhesive layer and the isolation layer may be coated simultaneously onto the support. The surface of the isolation layer is then laminated to the surface of the contiguous layer.

If the photorelease layer is present, it is first coated onto the coversheet. The element is then formed as described above. Other ways of preparing the photosensitive elements of this invention will be apparent to those skilled in the art.

EXPOSURE

Any convenient source may be selected to provide actinic radiation absorbed by the photoinitiator system. The radiation can be natural or artificial, monochromatic or polychromatic, incoherent or coherent. Most of the actinic radiation should be absorbed by the photoinitiator system to provide efficient image formation. Conventional sources of actinic radiation include fluorescent, mercury vapor, mercury-xenon, metal additive, and arc lamps. Useful sources of coherent radiation are lasers whose emissions fall within or overlap the absorption bands of the photoinitiator system. Exposure is conventionally carried out through an image-bearing transparency, preferably a halftone or continuous tone color separation transparency. However, other means, such as a modulated scanning laser beam, cathode ray tube, and the like, can be used to imagewise expose the element. These alternative methods of exposing the element are considered to be equivalent to exposure through an image-bearing transparency.

IMAGE FORMATION: NON-PRECOLORED ELEMENTS

Following exposure and peeling-apart of a non-precolored element, the element is colored by applying a suitable colorant, generally know as a toner. The excess toner is removed, and toner remains only on the revealed regions (30) of the contiguous layer (16), i.e., the regions of the contiguous layer (16) from which the exposed regions (28) of the photohardenable layer (14) were removed. Suitable toners are described in Chu, U.S. Pat. No. 3,620,726; Gray, U.S. Pat. No. 3,909,282; Manger, U.S. Pat. No. 4,215,193; and Ruskin, U.S. Pat. No. 4,661,439. Toners may be applied by dusting with pads dipped in toners as disclosed in Burg, U.S. Pat. No. 3,060,024; hand-operated machine toning as disclosed in Sandner, U.S. Pat. No. 4,019,821; and automatic toning as disclosed in Tobias, U.S. Pat. No. 4,069,791. Colorant applied by a transfer process described in Burg, U.S. Pat. No. 3,060,025 using a precolored toning film, such as described in Fröhlich, U.S. Pat. No. 4,806,451, is considered to be toning within the scope of this application.

A non-precolored photosensitive element with a removable support is used to prepare multicolor surprint proofs from conventional negative halftone color separation transparencies. First, the support is removed from the photosensitive element; and the element minus the removable support is then adhered to a permanent support known as the receptor. The resulting composite structure is then exposed to actinic radiation through the coversheet using a color separation transparency or by an equivalent exposure process. The coversheet is subsequently peeled off the exposed element at room temperature or at an elevated temperature by stripping with a smooth, moderate to rapid, continuous motion, preferably at a peel angle of 180°. The revealed contiguous layer is then colored by applying a toner of a color corresponding to the color separation transparency used in the exposure step.

A multicolor surprint proof is prepared, by adhering an additional photosensitive element, minus its removable support, to the exposed, peeled apart photohardenable layer of the image previously prepared. The resulting element is exposed in register through a different color separation transparency, peeled apart, and toned as described above to produce a two color image. This sequence of steps may be repeated as many times as desired to produce a multicolor proof. A typical surprint proof comprises yellow, magenta, cyan, and black images. A topcoat, such as that described in Taylor, U.S. Pat. No. 4,921,776, may be applied to the surprint proof as a final protective layer.

IMAGE FORMATION: PRECOLORED ELEMENTS

Following exposure and peeling-apart of a precolored element, a one-color precolored image is produced. A precolored image, as used herein, refers to an image produced from a precolored element, i.e., an element comprising a colorant.

A precolored photosensitive element with a removable support is used to prepare surprint proofs from conventional halftone color separation transparencies. The support is removed from the photosensitive element and the element minus the removable support is then adhered to a permanent support known as the receptor. The resulting composite structure is exposed to actinic radiation through the coversheet using a color separation transparency or by an equivalent exposure process. If exposure is through a negative color separation transparency, an element which operates by photorelease should be used. If exposure is through a positive separation transparency, an element which operates by photoadherence should be used. The coversheet is then peeled off the exposed element as described above, to produce a single-color surprint proof.

A multicolor surprint proof is prepared by adhering an additional photosensitive element, minus its removable support, to the exposed, peeled apart photohardenable layer of the image previously prepared. The resulting element is exposed in register through a different color separation transparency and peeled apart as described above to produce a two-color image. This sequence of steps may be repeated as many times as desired to produce a multicolor proof. A topcoat, such as that described in Taylor, U.S. Pat. No. 4,921,776, may be applied to the surprint proof as a final protective layer.

Multicolor images may also be prepared by combining precolored and non-precolored photosensitive elements. For example, a four color surprint proof may be prepared from the precolored elements by the process described above. A fifth color is then added by removing the support from a non-precolored element and the element, minus the removable support, is laminated to the precolored image. The element is then exposed in register, peeled apart, and toned as described above to produce a five color proof which is made up of four precolored elements and one non-precolored element. Alternatively, a non-precolored element may replace one of the precolored elements in a four color proof. The precolored elements may also be combined with the non-precolored elements disclosed in Chu, U.S. Pat. Nos. 3,620,726 and 3,649,268. Other possible combinations of precolored and non-precolored elements will be apparent to those skilled in the art. Thus, the combination of precolored and non-precolored photosensitive elements permits the preparation of surprint proofs containing standard colors, i.e., colors which are supplied in precolored element, and specialty colors, i.e., colors which are not supplied in precolored elements.

INDUSTRIAL APPLICABILITY

The elements of this invention are useful for preparing colored images. These images are particularly useful in the graphic arts field, especially for color proofing in which proofs are prepared to duplicate the images produced by printing.

The advantageous properties of this invention can be observed by reference to the following examples which illustrate, but do not limit, the invention.

EXAMPLES

In the Examples which follow, "coating solution" refers to the mixture of solvents and additives coated on the coversheet, even though some of the additives may be in suspension rather than in solution. "Total solids" refers to the total amount of nonvolatile material in the coating solution even though some of the additives may be nonvolatile liquids at ambient temperature.

| GLOSSARY | |
|---|---|
| Calcofluor ® White | 7-Diethylamino-4-methylcoumarin; 2H-1-benzo-pyran-2-one, 7-(diethylamino)-; CAS 71173-56-3; American Cyanamid, Wayne, NJ |
| Carboset ® 525 | Poly(ethyl acrylate/methyl methacrylate/acrylic acid) 56/37/7; B. F. Goodrich Co., Cleveland, OH |
| o-Cl-HABI | 1,1'-Biimidazole, 2,2'-bis[o-chlorophenyl]-4,4',5,5'-tetraphenyl-; CAS 1707-68-2 |
| Cyan pigment | Monastral ® Blue G (BT 284D); C.I. Pigment Blue 15; copper phthalocyanine |
| Diene 55AC | Poly(cis-butadiene); Firestone, Akron, OH |
| Elvacite ® 2014 | Methyl methacrylate copolymer; E. I. du Pont de Nemours and Company, Wilmington, DE |
| Elvacite ® 2016 | Methyl methacrylate/n-butyl methacrylate copolymer; E. I. du Pont de Nemours and Company, Wilmington, DE |
| Elvacite ® 2042 | Poly(ethyl methacrylate); CAS 9093-42-3; E. I. du Pont de Nemours and Company, Wilmington, DE |
| Elvacite ® 2044 | Poly(n-butyl methacrylate); CAS 9003-63-8; E. I. du Pont de Nemours and Company, Wilmington, DE |
| Elvacite ® 2045 | Poly(iso-butyl methacrylate); CAS 9011-15-8; E. I. du Pont de Nemours and Company, Wilmington, DE |
| Elvacite ® 2051 | Poly(methyl methacrylate); MW 350,000; E. I. du Pont de Nemours and Company, Wilmington, DE |
| Elvax ® 140 | Ethylene vinyl acetate copolymer; E. I. du Pont de Nemours and Company, |

-continued
GLOSSARY

| | |
|---|---|
| Ebecryl ® 3704 | Wilmington, DE<br>Acrylated esters of epoxy resins; Hoechst-Celanese, Summit, NJ |
| FC-430 | Fluorad ® FC-430; fluoroaliphatic polymeric esters; CAS 11114-17-3; 3M, St. Paul, MN |
| Gentro ® 1506/27 | Styrene-butadiene random copolymeric rubber; Gen Corp., Akron, OH |
| Goodrite ® K-732 | Aqueous polyacrylic acid solution, partial sodium salt; B. F. Goodrich, Cleveland, OH |
| Hetron ® Q6332 | Unsaturated polyester resin; Ashland Chemical Co., Columbus, OH |
| Irganox ® 1010 | Tetra-bis-methylene-3-(3,5-di-tert-butyl-4-hydroxyphenyl) propionate methane; Ciba-Geigy, Hawthorne, NY |
| Magenta pigment | Quindo Magenta RV 6803; Harmon |
| 2-MBO | 2-Mercaptobenzoxazole; 2-benzoxazolethiol; CAS 2382-96-9 |
| Methacrylate dispersant | Elveron ® 6037; Poly(methyl-methacrylate/2-ethylhexyl acrylate - Desmodur ® N adduct; Mn 9,000 |
| Pluronic ® L-92 | Liquid (ethylene oxide/propylene oxide/ethylene oxide) A-B-A block copolymer; BASF, Parsippany, NJ |
| Polyox ® WSRN 3000 | Polyethylene oxide; MW 400,000; Union Carbide, Danbury, CT |
| PVP K-90 | Polyvinylpyrrolidone (MW 350,000); GAF Corp., Wayne, NJ |
| Raven ® 450 | Carbon black, C.I. Pigment Black 7; Cities Service Co. |
| Raven ® 1035 | Carbon black, C.I. Pigment Black 7; Cities Service Co. |
| Scarlet Pigment | Indofast ® Brilliant Scarlet R6300; C. I. Pigment Red 123 |
| Taktene ® CB221 | Poly (cis-butadiene); Polysar, Akron, OH |
| Tinopal ® PCR | 2-(Stilbyl)-(naphtho-1',2',4,5)-1,2,3-trizol-2''-sulfonic acid phenyl ester; CAS 6994-51-0; Ciba-Geigy, Ardsley, NY |
| Tinopal ® SFG | 3-Phenyl-7-[2'-(4'-N,N-diethylamino)-6'-chloro-1',3',5'-triazinylamino]-coumarin; Ciba-Geigy, Hawthorne, NY |
| Tinuvin ® 328 | 2-(2'-Hydroxy-3',5'-di-tert-amylphenyl)-benzotriazole; Ciba-Geigy, Hawthorne, NY |
| Triacetin | Glyceryl triacetate; Haarman & Reimer Corp., Springfield, NJ |
| Uvitex ® OB | Benzoxazole, 2,2'-(2,5-thiophenediyl)bis[5-(1,1-dimethylethyl)]; CAS 7128-64-5 |
| Vinac ® B-15 | Poly(vinyl acetate); MW 90,000; CAS 9003-20-7; Air Products and Chemicals, Allentown, PA |
| Yellow Pigment | Cromophtal ® Yellow 3G; C.I. Pigment Yellow 93; Ciba-Geigy, Hawthorne, NY |
| Zonyl ® FSN | Nonionic fluorosurfactant; E. I. du Pont de Nemours and Company, Wilmington, DE |

Control Example A and Examples 14 8 compare the number of pickoff defects and the effective dot area obtained using the photosensitive elements of this invention with the number of pickoff defects and the effective dot area obtained using elements which do not comprise the isolation and adhesive layers.

EXAMPLES 1–8

These examples illustrate the preparation and exposure of photosensitive elements of this invention.

Step 1

Photohardenable Layer (14)

The composition described in Table 1 was coated onto about 12.2 micron thick clear polyethylene terephthalate coversheet, which had been surface treated by electrostatic discharge at about 0.05 coulomb/ft$^2$ (0.544 coulomb/m$^2$), using conventional coating techniques. Coating conditions were 22.5% solids in dichloromethane at a coating weight of about 30 mg/dm$^2$. Following coating, a polyethylene release film was placed on top of the photohardenable layer to protect it until the rest of the element was formed. An element consisting of coversheet, photohardenable layer, and release film was formed.

TABLE 1
| Composition of the Photohardenable Layer$^a$ | |
|---|---|
| Elvacite ® 2051 | 43.51 |
| Ebecryl ® 3704 | 44.79 |
| Triacetin | 5.00 |
| o-Cl HABI | 2.50 |
| 2-MBO | 1.50 |
| Tinopal ® SFG | 2.00 |
| Tinuvin ® 328 | 0.20 |
| Polyox ® WSRN 3000 | 0.50 |

$^a$percent by weight

Step 2

Adhesive Layer (20)

A coating solution of 89.78% Diene 55AC, 9.97% Gentro ® 1506/27, and 0.25% Irganox ®1010 (5.5% solution in dichloromethane) was prepared.

Step 3 contiguous Layer (16)

A coating solution of 79.5% Taktene ®221, 20.0% Gentro ® 1506, and 0.5% of Irganox ® 1010 (7.7% solids in dichloromethane) was prepared.

Step 4

Isolation Layer (18)

A coating solution of Vinac ® B-15 (22.5% solids in dichloromethane) was prepared.

Step 5

Photosensitive Element (10)

The coating solutions for the contiguous layer and the isolation layer were coated simultaneously onto about 0.92 mil (about 23 micron) thick silicon treated polyethylene terephthalate film by a conventional multilayer coating technique to form an element consisting of polyethylene terephthalate film, isolation layer, and contiguous layer. The release film was removed from the element formed in Step 1, and the photohardenable layer was pressure laminated at room temperature to the contiguous layer to form an element consisting of: coversheet, photohardenable layer, contiguous layer, isolation layer, and polyethylene terephthalate film. The solution prepared in Step 2 was coated onto a support of about 0.92 mil (about 23 micron) thick silicon treated polyethylene terephthalate film to form an element consisting of adhesive layer and support.

The polyethylene terephthalate film was removed from the element consisting of coversheet, photohardenable layer, contiguous layer, isolation layer, and polyethylene terephthalate film and the resulting element was pressure laminated at room temperature to the element consisting of adhesive layer and support to form photosensitive element (10) consisting of coversheet (12), photohardenable layer (14), contiguous layer (16), isolation layer (18), adhesive layer (20), and support (22). Coating weights for the photohardenable layer, contiguous layer, isolation layer, and adhesive layer are provided in Table 2.

Step 6
Image Formation

The support was removed from the photosensitive element and the revealed adhesive layer laminated to Du Pont Cromalin® CRS/3 receptor stock (E. I. du Pont de Nemours and Company, Wilmington, Del.) to form an element consisting of receptor, adhesive layer, isolation layer, contiguous layer, photohardenable layer, and coversheet. This element was placed in a vacuum frame with the coversheet up, i.e., facing the light source. A test form consisting of an UGRA target (copyright 1982) and a field of 50 1.5 in (3.8 cm) diameter circles was placed on top of the coversheet with the emulsion side in contact with the coversheet. A vacuum was drawn on the element and transparency for 90 sec prior to exposure. The element was exposed for about 36 sec with the radiation from a 5 kw high pressure mercury vapor lamp (Violux® 5002S, Exposure Systems Company, Bridgeport, Conn.) equipped with a photopolymer bulb with a Kokomo® filter about 54 in (137 cm) above the element and transparency.

The exposed element was removed from the vacuum frame and placed on a heated (about 26° C.) peel table. The coversheet was removed by peeling back at 180° ("peel-back mode") in a smooth, continuous motion. The revealed portions of the contiguous layer were toned with Du Pont negative Cromalin® black toner using a Du Pont Automatic Toning Machine (E. I. du Pont de Nemours and Company, Wilmington, Del.) to produce a black, one-color image consisting of receptor, adhesive layer, isolation layer, black toned contiguous layer, and exposed and peeled-apart photohardenable layer.

The support was removed from a second photosensitive element and the revealed adhesive layer laminated to the one color image to form an element consisting of receptor, adhesive layer, isolation layer, black toned contiguous layer, exposed and peeled-apart photohardenable layer, adhesive layer, isolation layer, contiguous layer, photohardenable layer and coversheet. The element was exposed through the UGRA target and field of 50 1.5 in (3.8 cm) diameter circles as previously described. The UGRA target was placed in over an untoned region of the image. The circles overlapped, but were not in register with, those of the black image. The element was peeled apart and toned with cyan toner as previously described to form a two color image consisting of receptor, adhesive layer, isolation layer, black toned contiguous layer, exposed and peeled-apart photohardenable layer, adhesive layer, isolation layer, cyan toned contiguous layer, and exposed and peeled-apart photohardenable layer.

This process was repeated, first with magenta toner and then with yellow toner, to produce a four-color image consisting of: receptor, adhesive layer, isolation layer, black toned contiguous layer, exposed and peeled-apart photohardenable layer, adhesive layer, isolation layer, cyan toned contiguous layer, exposed and peeled-apart photohardenable layer, adhesive layer, isolation layer, magenta toned contiguous layer, exposed and peeled-apart photohardenable layer, adhesive layer, isolation layer, yellow toned contiguous layer, and exposed and peeled-apart photohardenable layer. The image was protected by a layer of conventional Cromalin® off-press proofing system topcoat.

Step 7
Effective Dot Area

Effective dot area (EDA) was measured for the cyan and magenta portions of the 30% and 50% regions of the UGRA test targets using a MacBeth RD 918 reflection densitometer which measures the amount of light reflected by a solid image. The instrument contains a series of filters so that each image may be illuminated with light appropriate for the colored image being evaluated. (The cyan image is illuminated with red light, etc.) To calculate the effective dot area the amount of light reflected by a particular region is compared with the amount of light reflected by the receptor and the amount of light reflected by a region with 100% toner coverage. Effective dot areas are provided in Table 3.

Step 8
Pickoff Defects

The 50 circles for each color and their overlapping regions were inspected for areas in which portions of the toned contiguous layer was missing. The number of locations in which the toned contiguous layer was missing was the number of pickoff defects. The number of pickoff defects is provided in Table 3.

CONTROL EXAMPLE A

Control Example A is a commercial multilayer, peel-apart, tonable photosensitive element (Cromalin® C/N negative off-press proofing film, E. I. du Pont de Nemours and Company, Wilmington, Del.) and represents the state of the art. Coating weights are given in Table 2. The element was exposed and toned as described in Step 6 of Example 1 to produce a four-color image. The number of pickoff defects and the effective dot areas for the cyan and magenta images at 30% dots and 50% dots using an UGRA target with 150 lines/in (60 lines/cm) are provided in Table 3.

TABLE 2

| Example | Coating Weight[a] | | | |
|---|---|---|---|---|
| | Photo-hardenable Layer | Contiguous Layer | Isolation Layer | Adhesive Layer |
| Control A | 37 | 125 | NA[b] | NA[b] |
| 1 | 30 | 42 | 75 | 50 |
| 2 | 30 | 42 | 55 | 35 |
| 3 | 29 | 50 | 40 | 25 |
| 4 | 37 | 100 | 60 | 35 |
| 5 | 37 | 50 | 60 | 35 |
| 6 | 37 | 100 | 60 | 15 |
| 7 | 37 | 50 | 60 | 15 |
| 8 | 37 | 50 | 20 | 15 |

[a] $mg/dm^2$
[b] NA = Not Applicable (Layer is not present in the element.)

TABLE 3

| Example | Pickoff Defects | Effective Dot Area | | | |
|---|---|---|---|---|---|
| | | Cyan | | Magenta | |
| | | 30% | 50% | 30% | 50% |
| Control A | 17 | 50 | 70 | 52 | 73 |
| 1 | 0 | 47 | 68 | 52 | 70 |
| 2 | 0 | 48 | 68 | 50 | 69 |
| 3 | 0 | 48 | 69 | 51 | 72 |
| 4 | 0 | 47 | 69 | 52 | 71 |
| 5 | 0 | 44 | 66 | 48 | 74 |
| 6 | 1 | 48 | 69 | 51 | 72 |
| 7 | 1 | 45 | 66 | 48 | 70 |

TABLE 3-continued

| Example | Pickoff Defects | Effective Dot Area | | | |
|---|---|---|---|---|---|
| | | Cyan | | Magenta | |
| | | 30% | 50% | 30% | 50% |
| 8 | 7 | 46 | 68 | 49 | 71 |

EXAMPLES 9–12

These examples illustrate photosensitive elements of this invention wherein the material used as the contiguous layer was also used as the adhesive layer. The procedure of Example 1 was repeated except that the material used in the contiguous layer was also coated as the adhesive layer. Coating weights are provided in Table 4. The number of pickoff defects and the effective dot areas for the cyan and magenta images at 30% dots and 50% dots using an UGRA target with 150 lines/in (60 lines/cm) are provided in Table 5.

TABLE 4

| Example | Coating Weight$^a$ | | | |
|---|---|---|---|---|
| | Photo-hardenable Layer | Contiguous Layer | Isolation Layer | Adhesive Layer |
| 9 | 30 | 42 | 75 | 50 |
| 10 | 30 | 62 | 55 | 35 |
| 11 | 30 | 62 | 55 | 50 |
| 12 | 30 | 62 | 55 | 70 |

$^a$mg/dm$^2$

TABLE 5

| Example | Pickoff Defects | Effective Dot Area | | | |
|---|---|---|---|---|---|
| | | Cyan | | Magenta | |
| | | 30% | 50% | 30% | 50% |
| 9 | 1 | 48 | 68 | 50 | 71 |
| 10 | 2 | 48 | 69 | 51 | 71 |
| 11 | 1 | 49 | 70 | 53 | 72 |
| 12 | 0 | 49 | 70 | 55 | 73 |

EXAMPLE 13

The procedure of Example 9 was repeated except that the isolation layer was Elvax ® 140. Coating weights were photohardenable layer, 30 mg/dm$^2$; contiguous layer, 30 mg/dm$^2$; isolation layer, 30 mg/dm$^2$; and adhesive layer, 35 mg/dm$^2$. The number of pickoff defects and the effective dot areas for the cyan and magenta images at 30% dots and 50% dots using an UGRA target with 150 lines/in (60 lines/cm) are provided in Table 6.

TABLE 6

| Example | Pickoff Defects | Effective Dot Area | | | |
|---|---|---|---|---|---|
| | | Cyan | | Magenta | |
| | | 30% | 50% | 30% | 50% |
| 13 | 2 | 49 | 68 | 53 | 71 |

EXAMPLE 14

The general procedure of Example 1 was followed to prepare a photosensitive element. The materials were the same as those in Example 1 except (1) the isolation layer was Elvacite ® 2042 and (2) the adhesive layer had the same composition as the contiguous layer. Coating weights were photohardenable layer, 30 mg/dm$^2$; contiguous layer, 42 mg/dm$^2$; isolation layer, 60 mg/dm$^2$; and adhesive layer, 25 mg/dm$^2$.

A one-color image was formed by removing the support from the photosensitive element and laminating the resulting element to Cromalin ® CR5 receptor stock (E. I. du Pont de Nemours and Company, Wilmington, Del.). The resulting element was exposed, peeled apart, and toned with magenta toner as described in Step 6 of Example 1. Exposure was carried out through a UGRA target. A special target consisting of a right triangle and a square was used to measure pickoff defects. An effective dot area was 72% was measured for 50% dots. No pickoff defects were observed.

EXAMPLE 15

The general procedure of Example 14 was followed to prepare a photosensitive element. The materials were the same as those in Example 14 except that the isolation layer was Elvacite ® 2044. Coating weights were photohardenable layer, 30 mg/dm$^2$; contiguous layer, 42 mg/dm$^2$; isolation layer, 63 mg/dm$^2$; and adhesive layer, 29 mg/dm$^2$. An effective dot area was 73% was measured for 50% dots. No pickoff defects were observed.

EXAMPLE 16

The general procedure of Example 14 was followed to prepare a photosensitive element. The materials were the same as those in Example 14 except that the isolation layer was Elvacite ® 2014. Coating weights were photohardenable layer, 30 mg/dm$^2$; contiguous layer, 42 mg/dm$^2$; isolation layer, 63 mg/dm$^2$; and adhesive layer, 29 mg/dm$^2$. An effective dot area of 75% was measured for 50% dots. No pickoff defects were observed.

EXAMPLES 17–20

The general procedure of Example 14 was followed to prepare a photosensitive element. The materials were the same as those in Example 1 except that the isolation layer was the material indicated in Table 8. Coating weights are provided in Table 7. Effective dot areas and pickoff defects are provided in Table 8.

TABLE 7

| Example | Coating Weight$^a$ | | | |
|---|---|---|---|---|
| | Photo-hardenable Layer | Contiguous Layer | Isolation Layer | Adhesive Layer |
| 17 | 39 | 39 | 62 | 30 |
| 18 | 39 | 45 | 40 | 29 |
| 19 | 39 | 40 | 51 | 18 |
| 20 | 39 | 41 | 90 | 27 |

$^a$mg/dm$^2$

TABLE 8

| Example | Isolation Layer | EDAY$^a$ | Pickoff Defects |
|---|---|---|---|
| 17 | Elvacite ® 2014 | 72 | none |
| 18 | Elvacite ® 2016 | 72 | minor |
| 19 | Elvacite ® 2044 | 72 | none |
| 20 | Elvacite ® 2045 | 73 | none |

$^a$Effective dot area for 50% dots measured for a magenta one-color image.

EXAMPLE 21

This example illustrates the preparation and exposure of photosensitive elements comprising a precolored photohardenable layer and a photorelease layer to form a multicolor negative surprint proof.

Step 1

Photorelease Layer (32)

A solution of WSRN-3000 (70.74% by weight total solids), PVP K-90 (2.19%), Goodrite® K-732 (16.90%), and Pluronic® L-92 (10.17%), was coated onto about 12.2 micron thick clear polyethylene terephthalate coversheet using conventional coating techniques. Coating conditions were 0.85% solids in water and coating weight about 2 mg/dm². After coating the element was rewound. An element consisting of a coversheet and a photorelease layer was formed.

Step 2

Precolored Photohardenable Layer (14)

The composition of the colored chips used in the precolored photopolymerizable layers is provided in Table 9.

TABLE 9

| Ingredient[a] | Yellow | Magenta | Scarlet | Cyan | Black |
| --- | --- | --- | --- | --- | --- |
| Yellow Pigment | 40 | — | — | — | — |
| Magenta Pigment | — | 45 | — | — | — |
| Scarlet Pigment | — | — | 30 | — | — |
| Cyan Pigment | — | — | — | 30 | — |
| Raven® 450 | — | — | — | — | 20 |
| Raven® 1035 | — | — | — | — | 20 |
| Methacrylate dispersant | 10 | 25 | 10 | 10 | 20 |
| Elvacite® 2051 | 50 | 30 | 60 | 60 | 40 |

[a]percent by weight

The coating solutions described in Table 10 were prepared by adding the ingredients shown in each of the columns to dichloromethane. The monomer and binder, Hetron® Q6332 and Elvacite® 2051, were added and dissolved first, followed by the colored chips, and then all the other ingredients. All solutions were prepared under yellow light. All quantities in Table 10 are in weight percent.

These compositions were each coated onto the element formed in Step 1. Each composition was extrusion die coated on top of the photorelease layer using conventional coating techniques. The coating solution was about 12% solids in dichloromethane. Coating weights are indicated in Table 10. Following coating, a polyethylene release film was placed on top of the precolored photohardenable layer to protect it until the rest of the element was formed. A series of four elements, each consisting of a coversheet, a photorelease layer, a precolored photohardenable layer and a release film, was formed. These elements corresponded to the four process colors which are yellow, magenta, cyan and black.

TABLE 10

| Ingredient[a] | Yellow | Magenta | Cyan | Black |
| --- | --- | --- | --- | --- |
| Yellow Chips | 25.04 | — | — | — |
| Magenta Chips | — | 17.66 | — | — |
| Scarlet Chips | — | 7.49 | — | — |
| Cyan Chips | — | — | 16.63 | — |
| Black Chips | — | — | — | 34.49 |
| Hetron® Q6332 | 53.10 | 54.31 | 53.83 | 54.39 |
| Elvacite® 2051 | 17.39 | 16.00 | 22.99 | 4.57 |
| o-Cl HABI | 1.00 | 1.02 | 1.02 | 1.02 |
| Carboset® 525 | 1.00 | 1.02 | 1.02 | 1.02 |
| Tinopal® PCR | 0.26 | 0.26 | 0.26 | 0.26 |
| 2-MBO | 0.50 | 0.51 | 0.51 | 0.51 |
| Tinopal® SFG | 0.50 | 0.51 | 0.51 | 0.51 |
| Polyox® WSRN-3000 | 1.00 | 1.02 | 1.02 | 1.02 |
| Tinuvin® 328 | 0.11 | 0.11 | 0.11 | 0.11 |
| Zonyl® FSN | 0.10 | 0.09 | 0.09 | 0.09 |
| Coating Weight[b] | 20 | 34 | 34 | 25 |

[a]percent by weight
[b]mg/dm²

Step 3

Contiguous Layer (16)

A coating solution of 79.5% Taktene® 221, 20.0% Gentro® 1506, and 0.5% of Irganox® 1010 (7.7% solids in dichloromethane) was prepared.

Step 4

Isolation Layer (18)

A coating solution of Vinac® B-15 (22.5% solids in dichloromethane) was prepared.

Step 5

Adhesive Layer (20)

A coating solution of 49.5% Taktene® 221, 50% Gentro® 1506, and 0.5% of Irganox® 1010 (7.7% solids in dichloromethane) was prepared.

Step 6

Precolored Photosensitive Element

The coating solutions for the contiguous layer prepared in Step 3 and the isolation layer prepared in Step 4 were coated simultaneously onto about 14 micron thick silicon treated polyethylene terephthalate release film by a conventional multilayer coating technique to form an element consisting of silicon treated polyethylene terephthalate release film, isolation layer, and contiguous layer.

The release film was removed from the element formed in Step 2, and the precolored photohardenable layer was pressure laminated at room temperature to the contiguous layer of the element just formed to form an element consisting of coversheet, photorelease layer, precolored photohardenable layer, contiguous layer, isolation layer, and silicon treated polyethylene terephthalate release film. The coating weight of the contiguous layer was 12 mg/dm² and the coating weight of the isolation layer was 75 mg/dm².

The solution prepared in Step 5 was coated onto a support of about 23 micron thick silicon treated polyethylene terephthalate release film to form an element consisting of adhesive layer and support. The coating weight of the adhesive layer was 50 mg/dm².

The polyethylene terephthalate film was removed from the element consisting of coversheet, photorelease layer, precolored photohardenable layer, contiguous layer, isolation layer, and silicon treated polyethylene terephthalate release film and the resulting element was pressure laminated at room temperature to the element consisting of adhesive layer and support to form a precolored photosensitive element consisting of: coversheet, photorelease layer, precolored photohardenable layer, contiguous layer, isolation layer, adhesive layer and support.

Step 7

One Color Image Formation

The support was removed from the black precolored photosensitive element and the revealed adhesive layer laminated to Du Pont Cromalin® CRS/3 receptor stock (E. I. du Pont de Nemours and Company, Wilmington, Del.) to form an element consisting of receptor, adhesive layer, isolation layer, contiguous layer, black pigmented photopolymer layer, photorelease layer and coversheet. This element was placed in a vacuum frame with the coversheet up (i.e., facing the light source). A test form consisting of an UGRA target (copyright 1982) and the Cromalin® Comm Guide was placed on top of the coversheet with the emulsion side in contact with the coversheet. A vacuum was drawn on the element and transparency for 120 sec prior to exposure. The element was exposed for about 10 sec with the radiation from a 5 kw high pressure mercury vapor lamp (Violux® 5002S, Exposure Systems Company, Bridgeport, Conn.) equipped with a photopolymer bulb with a Kokomo filter about 54 in (137 cm) above the element and transparency.

The exposed element was removed from the vacuum frame and placed on a peel table that was heated at about 26° C. The coversheet was removed by peeling back at 180°, i.e., the "peel-back mode", in a smooth, continuous motion. The regions which were exposed to actinic radiation released from the coversheet during the peeling process to produce a black, one color image consisting of receptor, adhesive layer, isolation layer, contiguous layer, and black precolored photohardenable layer. The unexposed regions remained with the coversheet and were removed. The image was the negative of the transparency used for exposure.

Step 8

Two color Image Formation

The support was removed from the cyan precolored photosensitive element and the revealed adhesive layer laminated to the one color image formed in Step 7 to form an element consisting of receptor, adhesive layer, isolation layer, contiguous layer, exposed black precolored photohardenable layer, adhesive layer, isolation layer, contiguous layer, cyan precolored photohardenable layer, photorelease layer and coversheet. The element was exposed and peeled apart as described in Step 7. The two-color image produced therefrom consisted of receptor, adhesive layer, isolation layer, contiguous layer, black precolored photohardenable layer, adhesive layer, isolation layer, contiguous layer, and cyan precolored photohardenable layer.

Step 9

Three and Four Color Image formation

The process of Step 8 was repeated, first with the magenta precolored photopolymerizable element and then with the yellow precolored photopolymerizable element to produce first a three color image and then a four-color image. The four color image consisted of receptor, adhesive layer, isolation layer, contiguous layer, black precolored photohardenable layer, adhesive layer, isolation layer, contiguous layer, cyan precolored photohardenable layer, adhesive layer, isolation layer, contiguous layer, magenta precolored photohardenable layer, adhesive layer, isolation layer, contiguous layer, and yellow precolored photohardenable layer. The image was protected by a layer of conventional Cromalin® off press proofing system topcoat.

Step 10

Image Evaluation

Effective dot area was measured for the cyan and magenta portions of the 30% and 50% regions of the UGRA test targets using a MacBeth RD 918 reflection densitometer as described in Step 7 of Example 1. The resolution was measured on the UGRA target by observing the dots in both the high light and shadow dot regions with a conventional 10x graphic arts magnification loop. Image quality is provided in Table 11.

TABLE 11

| Image | Dot Range | Effective Dot Area | | Pickoff Defects |
|---|---|---|---|---|
| | | 30% | 50% | |
| Yellow | 2-97 | 56 | 74 | None |
| Magenta | 3-96 | 57 | 76 | None |
| Cyan | 2-97 | 56 | 74 | None |
| Black | 2-98 | 55 | 75 | None |

EXAMPLE 22

A magenta one-color image was prepared by following the general procedure of Example 21, Steps 1-7 except that sufficient triacetin to make up 5% by weight total solids was added to the composition for the magenta precolored photohardenable layer described in Table 10. The element was then laminated to CRS/3 receptor stock, exposed, and peeled apart as described in Example 21, Step 7. The exposure was for about 10 sec. Effective dot areas at 30% and 50% dots were 55% and 73%, respectively. The image had 2-97% dots (UGRA target with 60 lines/cm). No pickoff defects were observed.

EXAMPLE 23

A magenta precolored photosensitive element was prepared by following the procedure of Example 21. Coating weights were as follows: photorelease layer, 2 mg/dm$^2$; photohardenable layer, 30 mg/dm$^2$; contiguous layer, 40 mg/dm$^2$; isolation layer, 75 mg/dm$^2$; and adhesive layer, 50 mg/dm$^2$. A four layer image was prepared following the procedure of Example 23 except that the magenta precolored element was used for each layer. Each exposure was for about 10 sec. Image quality is provided in Table 12.

TABLE 12

| Layer | Dot Range | Effective Dot Area | | Pickoff Defects |
|---|---|---|---|---|
| | | 30% | 50% | |
| First | 2-98 | 54 | 72 | None |
| Second | 2-98 | 55 | 73 | None |
| Third | 2-98 | 55 | 74 | None |
| Fourth | 2-98 | 55 | 74 | None |

EXAMPLE 24

This example illustrates the preparation and exposure of photosensitive elements comprising a precolored photohardenable layer to form a multicolor positive surprint proof.

The photosensitive element was prepared as described in Example 1, except that the coating solutions for the precolored photohardenable layer described in Table 13 were used in place of the composition for the photohardenable layer described in Step 1 of Example 1. As described in Example 1, the coating solutions were coated onto an electric discharge treated polyethylene terephthalate film.

TABLE 13

| Ingredient[a] | Yellow | Magenta | Cyan | Black |
|---|---|---|---|---|
| Yellow Chips | 24.52 | 1.52 | 1.23 | — |
| Magenta Chips | — | 21.86 | — | — |
| Cyan Chips | — | — | 17.70 | — |
| Black Chips | — | — | — | 33.44 |
| Hetron ® Q6332 | 39.68 | 39.11 | 39.40 | 37.16 |
| Elvacite ® 2051 | 26.42 | 28.03 | 32.23 | 22.21 |
| o-Cl HABI | 2.95 | 3.02 | 3.00 | 2.66 |
| 2-MBO | 1.70 | 1.72 | 1.69 | 1.72 |
| Calcofluor ® White | 1.97 | 1.97 | 1.99 | 2.01 |
| Uvitex ® OB | 1.97 | 1.97 | 1.99 | — |
| FC-430 | 0.10 | 0.10 | 0.10 | 0.10 |
| Polyox ® WSRN-3000 | 0.69 | 0.70 | 0.67 | 0.70 |
| Coating Weight[b] | 25 | 26 | 29 | 26 |

[a] percent by weight
[b] mg/dm$^2$

The support was removed for the black precolored photosensitive element and the revealed adhesive layer laminated to Du Pont cromalin ® CRS/3 receptor stock (E. I. du Pont de Nemours and Company, Wilmington, Del.) to form an element consisting of receptor, adhesive layer, isolation layer, contiguous layer, black pigmented photopolymer layer, and coversheet. This element was exposed to actinic radiation and peeled apart as described in Example 21, Step 7, to produce a black, one-color image consisting of receptor, adhesive layer, isolation layer, contiguous layer, and black precolored photohardenable layer. The exposed regions remained with the coversheet and were removed. The image was the positive of the transparency used for exposure.

Following the procedure of Example 21, Steps 8 and 9, a two color, a three color, and a four color image were produced. The image was evaluated as described in Example 21, Step 10. Image quality is given in Table 14.

TABLE 14

| Image | Dot Range | Effective Dot Area 30% | 50% | Pickoff Defects |
|---|---|---|---|---|
| Yellow | 2-97 | 56 | 75 | None |
| Magenta | 2-98 | 54 | 73 | None |
| Cyan | 2-97 | 55 | 74 | None |
| Black | 2-98 | 54 | 74 | None |

EXAMPLE 25

A cyan precolored photosensitive element was prepared by following the general procedure of Example 1. Coating weights were as follows: photohardenable layer, 20 mg/dm$^2$; contiguous layer, 45 mg/dm$^2$; isolation layer, 75 mg/dm$^2$; and adhesive layer, 50 mg/dm$^2$. A four layer image was prepared following the procedure of Example 1 except that the cyan precolored element was used for each layer. Each exposure was for about 10 sec. Image quality is given in Table 15.

TABLE 15

| Layer | Dot Range | Effective Dot Area 30% | 50% | Pickoff Defects |
|---|---|---|---|---|
| First | 2-98 | 52 | 72 | None |
| Second | 2-98 | 54 | 73 | None |
| Third | 2-98 | 54 | 74 | None |
| Fourth | 3-98 | 54 | 75 | None |

Having described the invention, we now claim the following and their equivalents.

What is claimed is:

1. A multilayer, peel-apart, photosensitive element comprising, in order:
   (1) a strippable coversheet which is transparent to actinic radiation;
   (2) a photohardenable layer;
   (3) a contiguous layer; and
   (4) a support;
the improvement wherein said photosensitive element additionally comprises:
   (5) a non-elastomeric isolation layer; and
   (6) an adhesive layer;
wherein said isolation layer and said adhesive layer are arranged so that the photosensitive element comprises, in order from top to bottom, said coversheet, said photohardenable layer, said contiguous layer, said isolation layer, said adhesive layer, and said support.

2. The element of claim 1 wherein the photohardenable layer comprises a colorant present in sufficient amount to uniformly color the image formed from said element.

3. The element of claim 1 or 2 wherein the photohardenable layer comprises a monomer, a binder, and a photoinitiator system activatible by actinic radiation, wherein said binder is present in sufficient amount to form a film when said photohardenable layer is coated, said monomer is present in sufficient amount to alter the relative adhesive relationship so that, on peeling apart, either said unexposed or exposed regions of said photohardenable layer are removed with said coversheet while the other of said regions remain on said contiguous layer, and said photoinitiator system is present in sufficient amount to initiate polymerization of said monomer on exposure to actinic radiation.

4. The element of claim 3 wherein the isolation layer consists essentially of a non-elastomeric organic polymer.

5. The element of claim 4 wherein the non-elastomeric organic polymer is a polymer or copolymer of vinyl acetate, or an acrylic or methacrylic polymer or copolymer.

6. The element of claim 5 wherein said non-elastomeric organic polymer consists essentially of a polymer selected from the group consisting of poly(vinyl acetate), ethylene/vinyl acetate copolymers, poly(methyl methacrylate), poly(ethyl methacrylate), poly(n-butyl methacrylate), poly(iso-butyl methacrylate), and methyl methacrylate/butyl methacrylate copolymers, and compatible mixtures thereof.

7. The element of claim 6 wherein said non-elastomeric organic polymer is poly(vinyl acetate).

8. The element of claim 2 additionally comprising a photorelease layer between the coversheet and the photohardenable layer.

9. The element of claim 1 or 2 wherein the support is removable.

10. A process for forming a colored image comprising, in order, the steps of:

(A) providing a peel-apart photosensitive element comprising, in order:
  (1) a strippable coversheet which is transparent to actinic radiation;
  (2) a photohardenable layer;
  (3) a contiguous layer;
  (4) a non-elastomeric isolation layer;
  (5) an adhesive layer; and
  (6) a removable support;
(B) removing the removable support from said element;
(C) adhering said element, minus said removable support, to a receptor;
(D) imagewise exposing the element formed in step (C) to actinic radiation;
(E) peeling off said coversheet whereby the unexposed regions of said photohardenable layer adhere more strongly to said contiguous layer and the exposed regions of said photohardenable layer adhere more strongly to said coversheet and are removed with said coversheet revealing portions of said contiguous layer in regions not exposed in step (D);
(F) applying a colorant to the surface of said contiguous layer revealed in step (E) to form an image.

11. The process of claim 10 wherein the photohardenable layer consists essentially of a monomer, a binder, and a photoinitiator system activatible by actinic radiation, wherein the binder is present in sufficient amount to form a film when said photohardenable layer is coated, the monomer is present in sufficient amount to alter the relative adhesive relationship so that, on peeling apart, the unexposed regions of said photohardenable layer adhere more strongly to said contiguous layer and the exposed regions of said photohardenable layer adhere more strongly to said coversheet, and said photoinitiator system is present in sufficient amount to initiate polymerization of said monomer on exposure to actinic radiation.

12. The process of claim 10 wherein the isolation layer consists essentially of a non-elastomeric organic polymer.

13. The process of claim 12 wherein the non-elastomeric organic polymer is a polymer or copolymer of vinyl aceate or an acrylic polymer or copolymer.

14. The process of claim 10 additionally comprising, after step (F), the following steps, which are carried out, in order, at least once to produce a multicolor image:
  (G) removing the removable support from an additional peel-apart photosensitive element; said additional peel-apart photosensitive element comprising, in order:
    (1) a strippable coversheet which is transparent to actinic radiation;
    (2) a photohardenable layer;
    (3) a contiguous layer;
    (4) a non-elastomeric isolation layer;
    (5) an adhesive layer; and
    (6) a removable support;
  (H) adhering said element, minus said removable support, to the surface of the exposed and peeled apart photohardenable layer of the previously formed image;
  (I) imagewise exposing the element formed in step (H) to actinic radiation, said exposure being carried out in register with said previously formed image;
  (J) peeling off the coversheet of the element whereby the unexposed regions of said photohardenable layer adhere more strongly to the contiguous layer and the exposed regions of the photohardenable layer adhere more strongly to the coversheet and are removed with the coversheet revealing portions of said contiguous layer in regions not exposed in step (I); and
  (K) applying a colorant to the surface of the contiguous layer revealed in step (J) to form a multicolor image.

15. A process for forming a colored image comprising, in order, the steps of:
  (A) providing a peel-apart photosensitive element comprising, in order:
    (1) a strippable coversheet which is transparent to actinic radiation;
    (2) a photohardenable layer comprising a colorant present in sufficient amount to uniformly color the image to a sufficient optical density;
    (3) a contiguous layer;
    (4) a non-elastomeric isolation layer;
    (5) an adhesive layer; and
    (6) a removable support;
  (B) removing the removable support from said element;
  (C) adhering said element, minus said removable support, to a receptor;
  (D) imagewise exposing the element formed in step (C) to actinic radiation; and
  (E) peeling off said coversheet whereby either the unexposed or exposed regions of said photohardenable layer are removed with said coversheet while the other of said unexposed and exposed regions remain on said contiguous layer.

16. The process of claim 15 wherein the photohardenable layer consists essentially of a monomer, a binder, and a photoinitiator system activatible by actinic radiation, wherein said binder is present in sufficient amount to form a film when said photohardenable layer is coated, said monomer is present in sufficient amount to alter the relative adhesive relationship so that, on peeling apart, either the unexposed or exposed regions of said photohardenable layer adhere more strongly to said contiguous layer and the other of the unexposed and exposed regions of said photohardenable layer adhere more strongly to said coversheet, and said photoinitiator system is present in sufficient amount to initiate polymerizaton of said monomer on exposure to actinic radiation.

17. The process of claim 16 wherein the exposed regions of said photohardenable layer remain on the contiguous layer and the unexposed regions of said photohardenable layer are removed with the coversheet.

18. The process of claim 15 wherein the photosensitive element additionally comprises a photorelease layer between the coversheet and the photohardenable layer.

19. The process of claim 15 additionally comprising after step (E), the following steps, which are carried out, in order, at least once to produce a multicolor image:
  (F) removing the removable support from an additional peel-apart photosensitive element; said additional peel-apart photosensitive element comprising, in order;
    (1) a strippable coversheet which is transparent to actinic radiation;

(2) a photohardenable layer comprising a colorant, present in sufficient amount to uniformly color the image to a sufficient optical density;
(3) a contiguous layer;
(4) a non-elastomeric isolation layer;
(5) an adhesive layer; and
(6) a removable support;
(G) adhering said element, minus said removable support, to the surface of the exposed and peeled apart photohardenable layer of the previously formed image;
(H) exposing the element formed in step (G) to actinic radiation, said exposure being carried out in register with said previously formed image; and
(I) peeling off the coversheet of the element formed in step (G) to form a multicolor image.

20. The process of claim 19 wherein said isolation layer consists essentially of a non-elastomeric organic polymer.

21. The process of claim 20 wherein said non-elastomeric organic polymer is a polymer or copolymer of vinyl acetate or an acrylic polymer or copolymer.

* * * * *